United States Patent [19]

Lyyra

[11] Patent Number: 4,751,654

[45] Date of Patent: Jun. 14, 1988

[54] METHOD OF AND ARRANGEMENT FOR MEASURING IMPEDANCES IN MEASURING CIRCUITS HAVING PROGRAMMED MEMORY

[75] Inventor: Matti Lyyra, Vantaa, Finland

[73] Assignee: Vaisala Oy, Finland

[21] Appl. No.: 791,911

[22] Filed: Oct. 28, 1985

[30] Foreign Application Priority Data

Oct. 26, 1984 [FI] Finland .................................. 844219

[51] Int. Cl.$^4$ ...................... G01R 27/26; G01R 27/00; G08C 15/06

[52] U.S. Cl. ................................... 364/482; 324/57 R; 340/870.01; 340/870.04; 364/571

[58] Field of Search .......................... 364/571, 482, 577; 73/708; 324/60 R, 65 R, 61 QS, 60 C, 60 CD; 340/870.1, 870.04

[56] References Cited

U.S. PATENT DOCUMENTS

| | | | |
|---|---|---|---|
| 2,591,600 | 4/1952 | Pear, Jr. ......................... | 340/870.04 |
| 2,753,547 | 7/1956 | Donath et al. .................. | 340/870.04 |
| 3,480,857 | 12/1969 | Bialko et al. ...................... | 324/60 R |
| 3,735,371 | 6/1971 | Lerner et al. ................... | 340/870.04 |
| 3,750,155 | 8/1971 | Oman ............................. | 340/870.04 |
| 4,187,459 | 2/1980 | Wolfendale ....................... | 324/60 C |
| 4,187,460 | 2/1980 | Dauge et al. ..................... | 324/60 C |
| 4,192,005 | 3/1980 | Kurtz ................................ | 364/571 |
| 4,195,349 | 3/1980 | Balkanli ............................ | 364/571 |
| 4,295,090 | 10/1981 | Ponkala ............................ | 324/60 C |
| 4,295,091 | 10/1981 | Ponkala ............................ | 324/60 C |
| 4,342,089 | 7/1982 | Hall .................................. | 364/571 |
| 4,405,990 | 9/1983 | Pickering et al. .................. | 364/571 |
| 4,420,809 | 12/1983 | Pierce .............................. | 364/571 |
| 4,481,514 | 11/1984 | Beukers et al. .................. | 340/870.1 |
| 4,546,441 | 10/1985 | Burch .............................. | 364/482 |
| 4,549,180 | 10/1985 | Masuda ........................... | 340/870.04 |
| 4,592,002 | 5/1986 | Bozarth, Jr. et al. ............... | 73/708 |
| 4,593,370 | 6/1986 | Balkanli ............................ | 364/571 |
| 4,598,381 | 7/1986 | Cucci ............................... | 364/571 |

OTHER PUBLICATIONS

T. George Barnett, Monolithic timers form transducer-to-recorder interface, Electronics, vol. 50, No. 18, Sep. 1977, p. 98.

Primary Examiner—Parshotam S. Lall
Assistant Examiner—S. A. Melnick
Attorney, Agent, or Firm—Steinberg & Raskin

[57] ABSTRACT

A method of and arrangement for measuring impedances, particularly low capacitances, by alternately connecting one or more reference impedances and sensor impedances to a measuring circuit. A programmed memory is used to take into account the individual non-linearities of the impedance sensor(s) and, optionally, to compensate variations of ambient circumstances such as temperature.

9 Claims, 5 Drawing Sheets

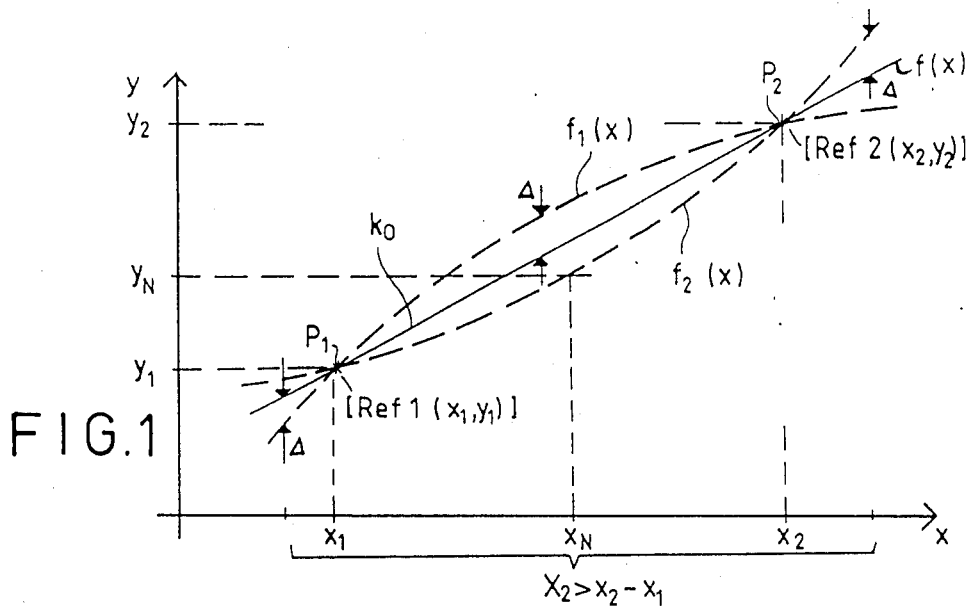

METHOD OF AND ARRANGEMENT FOR MEASURING IMPEDANCES IN MEASURING CIRCUITS HAVING PROGRAMMED MEMORY

BACKGROUND OF THE INVENTION

1. Field of the Invention

This invention generally relates to a method of, and an arrangement for, measuring impedances, particularly capacitors having individual non-linear characteristic low capacitance values over a range, in a measuring circuit particularly useful in radiosondes for measuring various physical parameters such as pressure, temperature and humidity.

2. Description of the Prior Art

It has been proposed in the prior art to use an impedance as an electrical sensor for measuring various physical quantities. The operation of such impedance sensors is based on the fact that the impedance value of the sensors is a function of the physical quantity to be measured, such as pressure, temperature, humidity, the position of an observed item, force, etc. Examples of such impedance sensors are strain gauges, pressure-sensitive and/or temperature-sensitive resistors, and capacitors having condenser plates separated by a dielectric. Such capacitors can sense pressure or temperature as a function of the mutual position of the condenser plates, or can sense relative humidity as a function of the variation in the dielectric constant. The manufacturing tolerances of the conventional impedance sensors render the same individual, that is, each exhibits a different non-linear response characteristic of impedance values over the range of measurement.

A measuring circuit which utilizes capacitive sensors was described in U.S. Pat. Nos. 4,295,090 and 4,295,091, which respectively correspond to Finnish Pat. Nos. 54,664 and 57,319, and in U.S. patent application Ser. No. 739,326, filed May 30, 1985 now abandoned. These patents and application describe a method of, and an arrangement for, measuring low capacitance values, and the entire contents of said patents and application are incorporated herein by reference.

The low capacitance values of these capacitive sensors range from a few picofarads to about twenty, to forty picofarads or, at most, a hundred picofarads. The measurement of such low capacitance values entails problems due to, among other factors, stray capacitance, input voltage variations, electrical interference, and other causes.

When measuring pressure, temperature, humidity, or other physical quantities with electrical or electromechanical sensors, it has been proposed in the prior art to connect one, or more, reference impedances of a stable, known impedance value to the measuring circuit so that inaccuracies of the sensor and/or in the measuring circuit could be compensated for. Thus, it is known to connect a reference capacitor having a known capacitance value to the measuring circuit, and to alternately connect a capacitive sensor having a capacitive value to be measured to the measuring circuit in place of the reference capacitor. More particularly, the reference capacitor and the capacitive sensor are alternately connected, each in its turn, to an input of an RC-oscillator whose output frequency is a function of the capacitance connected to the oscillator at that time. The measuring circuit can be suitably adjusted so that an output signal derived from the reference capacitor may, for each measurement, be set to a correct level.

Some measuring circuits, particularly those using bridge networks, utilize one reference impedance, in which case, the measurement of the sensor impedance value is accurate only if the reference impedance is close to the sensor impedance value, which occurs when the bridge network is balanced. The greater the deviation between the sensor impedance value and the reference impedance value, the greater will be the measurement errors derived, for example, from variations in the measurement dynamics of the measuring circuit. Of course, the one-reference measuring circuit has the advantages of simplicity in construction and in calculation.

Other measuring circuits utilize two or more references in order to increase their measuring accuracy over a wider range. However, the two- or multi-reference measuring circuits have the disadvantages of complexity in construction and of calculation.

SUMMARY OF THE INVENTION

1. Objects of the Invention

It is an object of this invention to overcome the drawbacks associated with the aforementioned measuring circuits.

Another object of this invention is to eliminate the complex calculations previously required by prior art measuring circuits of the above type for obtaining the results of the measurement.

An additional object of this invention is to increase the speed of obtaining the results of the measurement in prior art measuring circuits of the above type.

Yet another object of this invention is to decrease the cost of the measuring circuit of the above type.

2. Features of the Invention

In keeping with these objects and others which will become apparent hereinafter, one feature of this invention resides, briefly stated, in a method of, and an arrangement for, measuring impedances, particularly those exhibiting individual non-linear characteristic impedance values over a range. At least one reference impedance having a known impedance value within the range is connected to a measuring circuit. A sensor whose impedance is to be measured is alternately connected, in place of the reference impedance, to the measuring circuit.

In order to take into account the individual non-linear characteristic impedance values of the sensor i.e. the response characteristic curve of the sensor, this invention proposes providing a solid-state memory having memory addresses and data storage locations. This invention generates, during a calibration mode of operation, calibration signals indicative of the individual impedance values, and stores the generated calibration signals in the memory at selected data storage locations associated with respective memory addresses. In other words, the individual characteristic impedance values, or, put another way, the response characteristic curve of the sensor, is stored in the memory during the calibration mode. These impedance values correspond to physical quantities to be measured by the sensor.

Thereupon, once the memory is so programmed with the response characteristic curve, a memory input signal is generated during a measurement mode of operation wherein the sensor impedance is measured. The memory input signal is indicative of one of the memory addresses. A memory output signal which is associated with said one memory address is thereupon generated. The memory output signal is indicative of the calibration signal stored at that address and, in turn, of the impedance value associated therewith. The physical quantity to be measured by the sensor is thus obtained directly and quickly from the memory. No complex calculations are required. The speed of obtaining the measured physical quantity is extremely fast. Repetitive measurements can be conducted with a greater efficiency than in the prior art.

The memory can also be programmed to compensate for variations of ambient circumstances, for example, temperature. In a preferred embodiment, the memory can be divided into multiple tables, each for a predetermined temperature or range of temperatures. Temperature compensated values are calculated during calibration and stored in selected tables of the memory. Thereupon, the memory input signal is generated not only with data indicative of the memory address of the appropriate calibration signal, but also with data indicative of the table. In this way, both the individual response characteristic of the sensor and the temperature surrounding the sensor can be simultaneously taken into account. Again, no complex calculations are required.

This invention is of particular advantage in radiosondes for the telemetrical measurement of atmospheric pressure, temperature and/or humidity with the aid of a capacitive sensor having a low capacitance value, i.e., ranging from 0 picofarads to 100 picofarads. An accurate measurement and linearization of the aforementioned physical quantities, as well as an accurate compensation for ambient circumstances, can be performed quickly and cheaply by solid-state, microprocessor-based components. The measurement data relating to the sensor, which includes data required for linearization purposes and which may include data for compensation purposes, is coded to a suitable form and stored in the memory during the calibration mode, whereupon the data output of the memory is directly and rapidly accessible without calculation during the measurement mode of operation.

The novel features which are considered as characteristic of the invention are set forth in particular in the appended claims. The invention itself, however, both as to its construction and its method of operation, together with additional objects and advantages thereof, best will be understood from the following description of specific embodiments when read in connection with the accompanying drawings.

BRIEF DESCRIPTION OF THE DRAWINGS

FIG. 1 is a two-coordinate system graph illustrating the individual non-linear response characteristic curves of a sensor in a two-reference impedance measuring method;

FIG. 2 is a diagrammatic view of a memory table programmed in accordance with this invention;

FIG. 3 is a diagrammatic view of a memory table and additional control circuitry in accordance with this invention;

DETAILED DESCRIPTION OF THE PREFERRED EMBODIMENTS

Figure 4A:
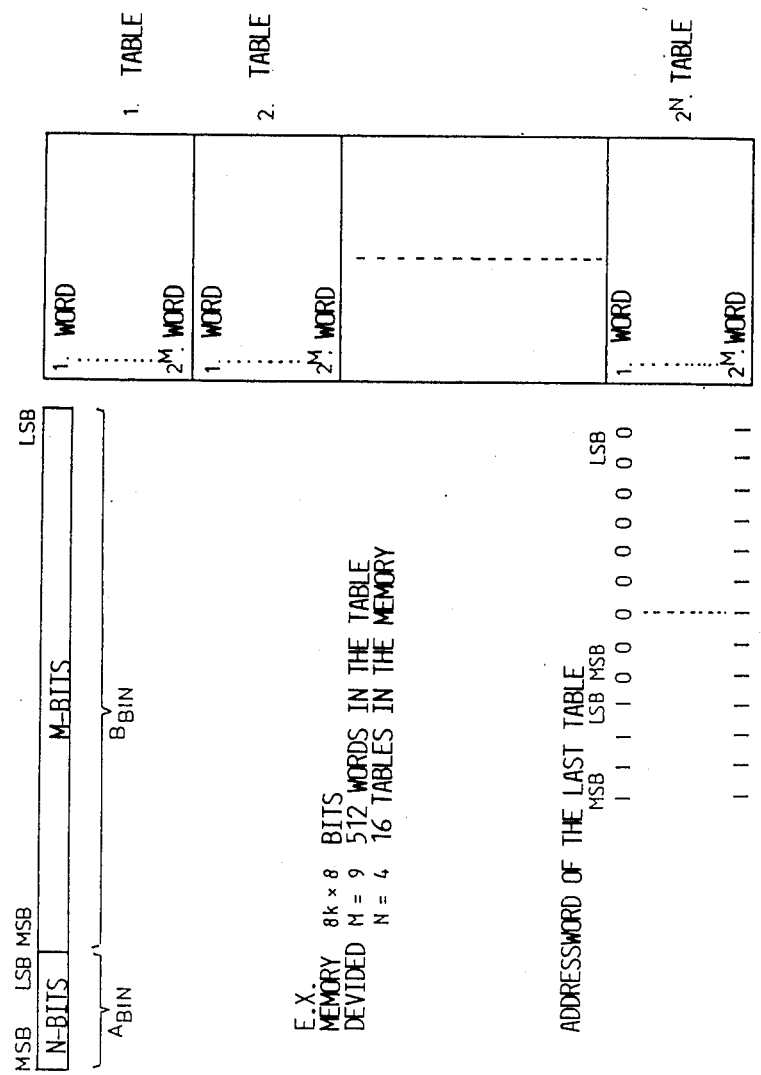
FIG. 4A is a diagrammatic view of a memory divided into many tables programmed in accordance with this invention for compensation purposes.

Referring now to the drawings, a better understanding of a measuring method in which two reference impedances are utilized in accordance with a preferred embodiment of this invention can be obtained from FIG. 1 in which an X-Y coordinate system is depicted. The X axis depicts input variables; the Y axis depicts output variables. The first reference impedance is plotted at point $P_1$ and has coordinates $(x_1, y_1)$. The second reference impedance is plotted at point $P_2$ and has coordinates $(x_2, y_2)$. Points $P_1$ and $P_2$ are fixed, and a line $k_o$ or $f(x)$ is connected between these points, and defines an ideal, linear function of the system. However, in practice, due to individual non-linearities of the impedance sensors caused, for example, by manufacturing tolerances as discussed above, and/or due to changes in ambient circumstances caused, for example, by changes in temperature in the vicinity of the impedance sensor, the response characteristic of the impedance sensor is not linear, but, instead, is curved on both sides of the line $k_o$, as schematically represented by the curves $f_1(x)$ and $f_2(x)$. The measuring range is between points $x_2$ and $x_1$. The impedance sensor to be measured has coordinates $(x_N, y_N)$. The delta symbol $(\Delta)$ represents the error limit between the ideal characteristic line $k_o$ and the curves $f_1(x)$ and $f_2(x)$.

It is also within the spirit of this invention to use one reference impedance rather than two, or more, and, in the case of a single reference impedance, a single point is fixed on the graph, and a line characterizing the measuring system passes through this single point. With a single reference impedance, however, the measuring system has a smaller range that that obtained with two or more reference impedances.

The first reference impedance $P_1$ eliminates the transition error $[y_N=f(x_N)\pm\Delta x]$ caused by the measuring circuit, because the values of $x_1$ and $y_1$ are fixed. Similarly, the second reference impedance $P_2$ eliminates the sensitivity error $[y_N=f(x_N)\pm k(x_N-x_1)]$, because the values of $x_2$ and $y_2$ are fixed.

The errors introduced by the measured circuit are linearly corrected by the fixed constants $x_1$ and $x_2$. Such measuring circuit errors are typically caused by ambient temperature variations, stray capacitance caused by circuit loading, changes in the operating voltage, etc.

In a two-reference impedance measuring method, it is usual to initially measure the first reference impedance, then measure the sensor impedance and, finally, to measure the second reference impedance. In this so-called time-shared measuring sequence, the measured output values are $y_1$, $y_N$, $y_2$. From these values, a corrected output value $Y_N=(y_1-y_N)/(y_1-y_2)$ is calculated. Since $y_1$ and $y_2$ are constants, a linear correction can be made to the value $y_N$ located between them.

If the sensitivity of the impedance sensor is high, i.e., if $x_2-x_1>>x_1$, more reference impedances of constant values may be added to the measuring circuit in order to obtain a piecemeal linear correction. In this way, it is possible to at least partially eliminate the non-linear change of sensitivity of the measuring circuit.

As described so far, the reference impedances correct only errors caused by the measuring circuit itself. The overall circuit accuracy is determined by the stability of the reference impedances, provided, of course, that the calibration and the operating circumstances remain the same. The individual non-linear response characteristics of the sensor, and the variations introduced by changes in ambient circumstances, e.g., temperature dependence of the sensor, must be compensated for by calculation. One of the features of this invention is to eliminate such calculation, as described below.

By way of background, the characteristic model curve of a capacitive sensor having a capacitance $C_M$ to be measured and calibration coefficients $A_0, A_1 \ldots A_n$ is:

$$M(C_M) = A_0 C_M^0 + A_1 C_M^1 + A_2 C_M^2 + A_3 C_M^3 + A_4 C_M^4 + \ldots$$

When the capacitive sensor is connected to an RC-oscillator circuit, the cycle time T(c) is:

$$T(c) = k_0 + k_1 C + k_2 C^2.$$

If the dynamic value D of the capacitive sensor $D = [M(C_{max}) - M(C_{min})]/M(C_{min})$ is low, then the error cause by the measuring circuit can be assumd to be described by a linear model in which coefficients $k_0$ and $k_1$ may change from one measuring sequence to another, but not during a single measuring sequence. A measuring sequence may last for approximately one second. The coefficients $k_0$ and $k_1$ may vary, but slowly over a time period of minutes. Hence, the variation of the $k_0$ and $k_1$ coefficients is eliminated. The coefficient $k_2$ of the non-linear term of the cycle time is virtually included in the calibration coefficients $A_0, A_1 \ldots A_n$. The influence of $k_2$ is small and, with sufficient accuracy, will remain the same during the calibrating mode and the measuring mode of operation. If two reference capacitors $C_{k1}$ and $C_{k2}$ are used in a measuring sequence in which the first reference capacitor $C_{k1}$ is initially connected to the measuring circuit, and then the capacitor $C_M$ to be measured is connected and, finally, the second reference capacitor $C_{k2}$ is connected, then the cycle times $T_{k1}, T_M, T_{k2}$ respectively corresponding to the capacitors $C_{k1}, C_M, C_{k2}$ can be measured, and a corrected output value $Y_M$ can be calculated as follows:

$$Y_M = (T_{k2} - T_M)/(T_{k2} - T_{k1}) = (C_{k2} - C_M)/(C_{k2} - C_{k1}),$$

whereupon $$C_M = C_{k2}(1 - Y_M) + Y_M C_{k1}$$

Since $C_{k1}$ is usually 0 pF, then $C_M - C_{k2}(1 - Y_M)$.

A polynomial according to the model curve of a capacitive sensor is obtained by the values $C_M$ obtained during the calibrating mode of operation, thereby producing the calibration coefficients $A_0, A_1 \ldots A_n$. The corresponding values of $M(C_M)$ are calculated by means of these coefficients.

Figure 5:
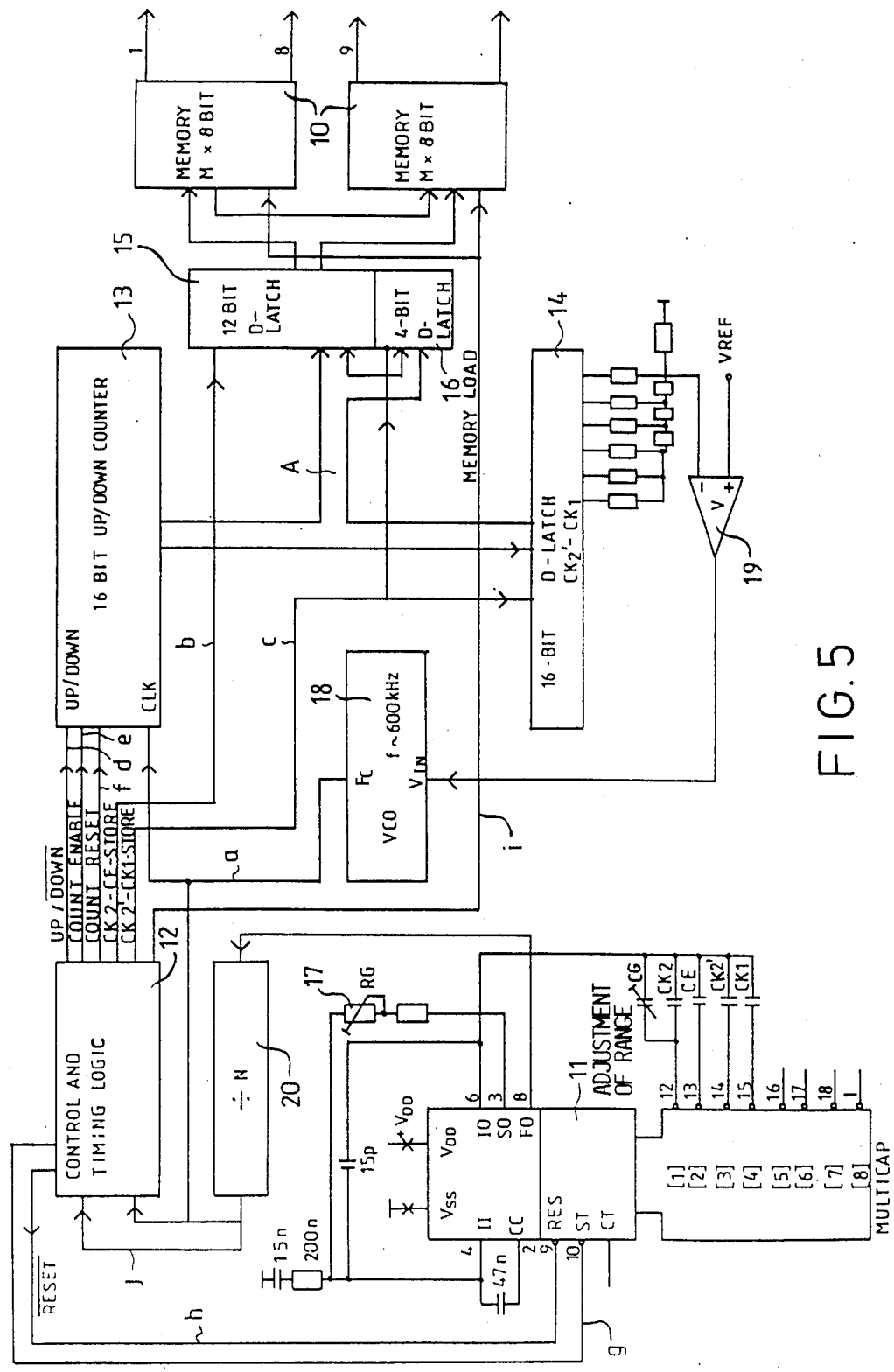
FIG. 5 is a block diagram of a first embodiment of an arrangement in accordance with this invention.

Turning to FIG. 5, an arrangement in accordance with a first embodiment of this invention comprises a measuring circuit 11 which is known under the tradmark Multicap and which is an integrated circuit particularly designed for measuring capacitive sensors. Reference is again made to said U.S. patents and application, the entire contents of which are incorporated herein by reference, for the design and operation of the measuring circuit 11. For the purposes of this discussion, it is believed sufficient to note that the measuring circuit 11 has an input terminal IO which is connected to a built-in RC-oscillator, and that each of the capacitors $C_{k2}, C_E$, $C_{k2}'$, and $C_{k1}$ is, in its respective turn, connected to the oscillator. The capacitances, ranging between 0 pF and 100 pF, determine the output frequency of the oscillator. The frequency is inversely related to the cycle time which, in turn, is directly related to the capacitance value. The circuit 11 also has a step terminal ST, a reset terminal RES and an output terminal FO which is connected to a divider 20 and, in turn, by output signal j to a control timer unit 12.

The arrangement further comprises an auxiliary clock 18 whose output signal a is connected to an input terminal CLK of a 16-bit up/down counter 13, as well as to an input terminal of the control unit 12. Controlled by the control unit 12, the measuring circuit 11 transmits a frequency $F_C$ which is related by a variable K and a time delay $\tau$ to the cycle time $T_C$ and to a capacitor connected to the circuit as follows:

$$T_C = 1/F_C = K \cdot C + \tau.$$

The frequency $F_C$ is conducted to the divider 20, whose output signal j changes at intervals of N pulses, so that $T_C = N \cdot (K \cdot C + \tau)$.

The output signal j controls the control unit 12 which controls the counter 13, as described below. The control unit 12 generates a START control signal g which is connected to the STEP terminal ST, a RESET control signal h which is connected to the RESET terminal RES, an UP/DOWN control signal d which is connected to an UP/DOWN terminal on the counter 13, a COUNT ENABLE control signal e which is connected to a COUNT ENABLE terminal on the counter 13, a COUNT RESET control signal f which is connected to a RESET terminal on the counter 13, a $C_{k2} - C_E$ STORE memory control signal b which is connected to a 12-bit D-latch 15, a $C_{k2}' - C_{k1}$ STORE memory control signal c which is connected to a 16-bit D-latch 14, and a MEMORY LOAD memory control signal i which is connected to a memory unit 10.

The operation of the arrangement, as described so far, is as follows: The control/timer unit 12 generates the RESET signal h and conducts the same to the circuit 11. This causes the first capacitor $C_{k2}$ to be selected and connected to the oscillator. At the same time, COUNT RESET signal f is generated and conducted to the counter 13; and the UP/DOWN signal d is generated and conducted to the counter 13 to start the same counting up. The clock 18 provides timing pulses to the control/timer unit 12 and the counter 13. The counter 13 continues to count until the divider 20 changes its status by generating and conducting output signal j to the unit 12. The time period of the counter $T_{k2} = N \cdot (KC_{K2} + \tau)$. The number of pulses $BC_{k2}$ contained in the counter 13 is $T_{k2} \cdot F_C$.

The control unit 12 now generates and conducts START signal g to the circuit 11 which now measures the next capacitor and, at the same time, the UP/DOWN signal d is generated and conducted to the counter 13 to start the counter counting down, until the output signal j of the divider changes its status again. The counter 13 continues counting until stopped by generation of COUNT ENABLE signal e which is conducted to the counter, at which time, the counter has counted down for the time period $T_E = N \cdot (K \cdot C_E + \tau)$. The number of pulses now contained in the counter is:

$$B(C_{k2}-C_E)=(T_{k2}-T_E)\cdot F_C=N\cdot K\cdot(C_{K2}-C_E)\cdot F_C.$$

The $\tau$ factor has been eliminated.

Memory signal b is now generated and conducted to the latch 15, wherein the contents of the counter 13 are now loaded via a 16-bit bus A. The ten most significant bits are loaded from the bus.

Once the counter 13 has been unloaded, the control unit 12 resets the counter 13, steps the circuit 11 to measure the next capacitor $C_{k2}'$, and starts the counter to start counting up again by generating signals e and d. Analogously to the above analysis, after a time period $T_{k2}'=N\cdot(K\cdot C_{k2}'+\tau)$, the output signal j is generated, and the contents of the counter 13 is $B(C_{k2}')=T_{k2}'\cdot F_C$. The counter stops counting upon generation of signal e, and the unit 12 steps the circuit 11 to measure the next capacitor $C_{k1}$. The counter is changed to down status by signal d and starts counting down by signal e. After a timer period $T_{k1}=N\cdot(K\cdot C_{k1}+\tau)$, the output signal j is generated, the counter stops counting by signal e, and the contents of the counter $B(C_{k2}'-C_{k1})=N\cdot K\cdot(C_{k2}'-C_{k1})\cdot F_C$ is now loaded, upon the generation of memory signal c, in part to a 4-bit D-latch 16, and in part to the latch 14. The output of latch 14 controls a 5-bit, resistor network and an OP-amplifier 19 and constitutes a digital-to-analog converter. A reference voltage $V_{REF}$ is supplied to one input of the amplifier 19. The output of the converter is zero, when the voltage, which is derived from the latch 14 and the resistor network, and which is supplied to the other input of the amplifier 19, matches the reference voltage. When these voltages are unequal, the voltage difference is amplified, and conveyed to the clock 18, the counter 13, the latch 14, and back to the converter. The maximum voltage variation that is allowed in a 16-bit word is about 3 bits.

The control unit 12 now zeroes the counter 13, resets the circuit 11, and repeats the sequence described above.

It will thus be seen that the time difference $T_{k2}-T_E$ and the time difference $T_{k2}'-T_{k1}$, are respectively proportional to the capacitive value difference $C_{k2}-C_E$ and the capacitive value difference $C_{k2}'-C_{k1}$, and are respectively proportional to the count difference $B(C_{k2}-C_E)$ and $B(C_{k2}'-C_{k1})$. As noted above, $$B(C_{k2}-C_E)=N\cdot K\cdot(C_{k2}-C_E)\cdot F_C \quad (1)$$

$$B(C_{k2}'-C_{k1})=N\cdot K\cdot(C_{k2}'-C_{k1})\cdot F_C \quad (2)$$

In these two equations (1) and (2), $K$ and $F_C$ depend on temperature but, in the same measuring sequence, they can be assumed to be constant. The count differences are, in effect, binary words, and by holding the binary word of equation (2), for example, constant by the latch 14, the resistor network, the amplifier 19, the reference voltage $V_{REF}$, the clock voltage $V_{CO}$, and the counter 13, and by controlling the three least significant bit sections in a memory in which the aforementioned voltage difference is stored, the temperature dependence of $K$ and $F_C$ can be eliminated.

A memory consisting, as shown in FIG. 5, of two solid-state memory circuits 10 interconnected together has, as is conventional, memory addresses, and data storage locations which may, if desired, be divided into data tables. The binary word $B(C_{k2}-C_E)$ of equation (1) controls the contents of the table areas of the memory. The binary word $B(C_{k2}'-C_{k1})$ selects the memory table. Each memory circuit 10 is preferably a conventional UEPROM memory having an 8-bit output. When the memory circuits 10 are interconnected as shown and arranged in parallel and controlled by the same binary word, a 16-bit resolution output signal can be generated, if required. One part of this output signal can be a sensor signal from which data relating to the capacitive measurement can be obtained, and the other part of the output signal can be a digital control signal useful, for example, in assisting the readout of the measurement, e.g., by setting a limit, or an alarm, etc.

During a calibrating mode of operation, the memory is programmed. The sensitivity of the measuring circuit is adjusted by adjusting variable resistor $R_G$ (see 17 in FIG. 5). It is desired that the resistor $R_G$ be adjusted so that the control voltage is mid-way of its range.

The capacitive sensor may be adjusted by adjusting variable capacitor $C_G$ which is connected across capacitor $C_{k2}$. The sensor is adjusted to the reference conditions throughout its operating range and, if desired, to the ambient circumstances, e.g., pressure or temperature, etc. In a preferred case, the sensor is adjusted so that the binary word $$B(C_{k2}-C_E)\text{ in equation (1)} = \overset{MSB}{0}\ 1\ 1\ 1\ 1\ 1\ 1\ 1\ 1\ \overset{LSB}{1}$$

when the sensor is mid-way in its range.

The aforementioned individual non-linear response characteristic curve(s) $f_1(x)$ and $f_2(x)$ of the sensor or sensors in use, as well as compensation curve(s) for changing ambient circumstances if desired, are stored in the memory during the calibrating mode at sufficiently short intervals. If the input variable x in FIG. 1 represents the memory address, and the output variable y in FIG. 1 represents the calibration data in coded form, and the letter n represents the total number of addresses, then the memory addresses can be represented by $x_1 \ldots x_n$, the calibration data by $y_1=f(x_1) \ldots y_n=f(x_n)$. The memory is calibrated at short intervals $x=x_n-x_{n-1}=x_{n-1}-x_{n-2}$, etc. An input signal $D_{in}$ to the memory is indicative of the memory address associated with a measured impedance. An output signal $D_{out}$ from the memory is indicative of the calibration data at that address.

Hence, it is no longer necessary as in the prior art to take the characteristic curve into account with complex calculations after each measurement. The calibration data, i.e. the physical quantity being measured, is read out of the memory without calculation. The calibration data is stored in the memory in coded form, e.g., BIN, BCD, etc., and is directly decoded prior to readout. One part of the decoded data can be used for setting limit values.

FIGS. 2, 3, 4A and 4B depict various alternate embodiments of the memory. In FIG. 2, the memory circuit 10 comprises a single table having a used area $M_B$ and two unused areas $M_A$ and $M_C$ on opposite ends of the used area. The memory addresses for n addresses begin at the first address $A_1$ and end at the last address $A_n$. Each address is a binary sensor signal produced as described above. In the first address, one of the bits $B_M$ is indicative of the adjustment of the offset of the measuring circuit. The last address $A_n$ is adjusted by the aforementioned variable resistor $R_G$. The response characteristic curve of the used impedance sensor and, optionally, of the measuring circuit, are stored in the table so that the memory output signal $D_{out}$ is generated as previously described.

In FIG. 3, the binary sensor signal indicative of each memory address is followed by a control bit x which is generated by a D-latch controller 10a and conducted along the line h. When the control bit equals zero, the lowermost byte is directed to the controller 10a. When the control bit equals one, the uppermost byte is directed to the output. The use of the control bit and the D-latch controller can be avoided by using two memory circuits connected in parallel (see FIG. 5).

In FIG. 4A, $A_{BIN}$ represents the binary value of the quantity to be compensated. Since the compensated quantity usually has a small influence on the value of the sensor impedance being measured, e.g., the temperature compensation of a pressure sensor is typically about 0.04% FSL/°C., the $A_{BIN}$ value can be expressed by fewer bits and with a considerably lower resolution. The compensation is tabulated on a piecemeal basis.

In FIG. 4A, $B_{BIN}$ represents the binary value of the quantity being measured. The measured range can be divided into $2^M$ words. The length of each word can be from 8 to 16 bits (if two 8-bit memory circuits are connected in parallel). A part of each word can be used for data readout of a linearized and coded measured value of the sensor. The other part of each word can be used for the readout of a digital ON/OFF signal for limit or alarm purposes.

During calibration of the memory shown in FIG. 4A, there are $2^N$ tables and $2^M$ words in each table. The measuring circuit is adjustable so that $0<B_{BIN}\leq 2^M$ and $0<A_{BIN}\leq 2^N$ in all situations. As noted previously, the measuring circuit and the sensor(s) are calibrated point by point at short intervals and, based on these values, a linearized and coded value corresponding to each point is programmed into the memory.

Figure 4B:
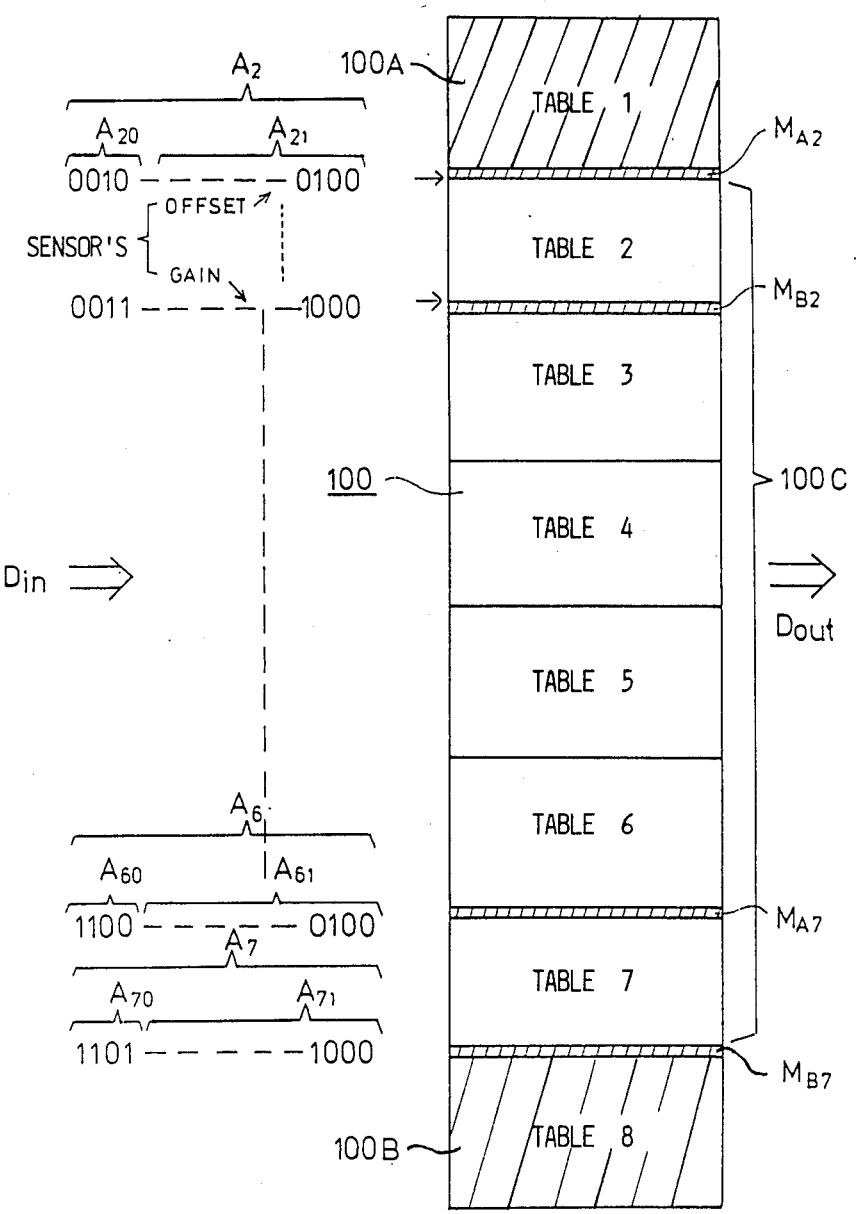
FIG. 4B is a specific example of the memory of FIG. 4A.

In the specific example of FIG. 4B, there are eight tables in the memory 100. Tables 1 and 8, corresponding to memory areas 100A and 100B, are not used. Also, the top and bottom areas $M_{A2}$, $M_{B2}$ ... $M_{A7}$, $M_{B7}$ of each table are not used. The memory area 100C is used. The binary signals $A_2$ ... $A_7$ contain a first part or binary compensation signal $A_{20}$ ... $A_{70}$ indicative of the quantity being compensated, and after the first part, a second part or second binary sensor signal $A_{21}$ ... $A_{71}$ indicative of the quantity being measured. The binary sensor signal $A_{21}$ ... $A_{71}$ at the top of each table contains information about the amplification of the measuring circuit. Such information includes the offset or constant term, as well as the slope, of the response characteristic curve.

In FIG. 4B, the memory input signal $D_{in}$ followed by an arrow represents a bit flow. The input signal $D_{in}$ arriving at the memory consists of more than one part. By adjusting the zero-point of the quantity being compensated, the binary compensation signal $A_{20}$ ... $A_{70}$ is adjusted to a point in the middle of the table in question. Each table is used at a certain different value of the quantity, e.g., temperature, being compensated.

Figure 6:
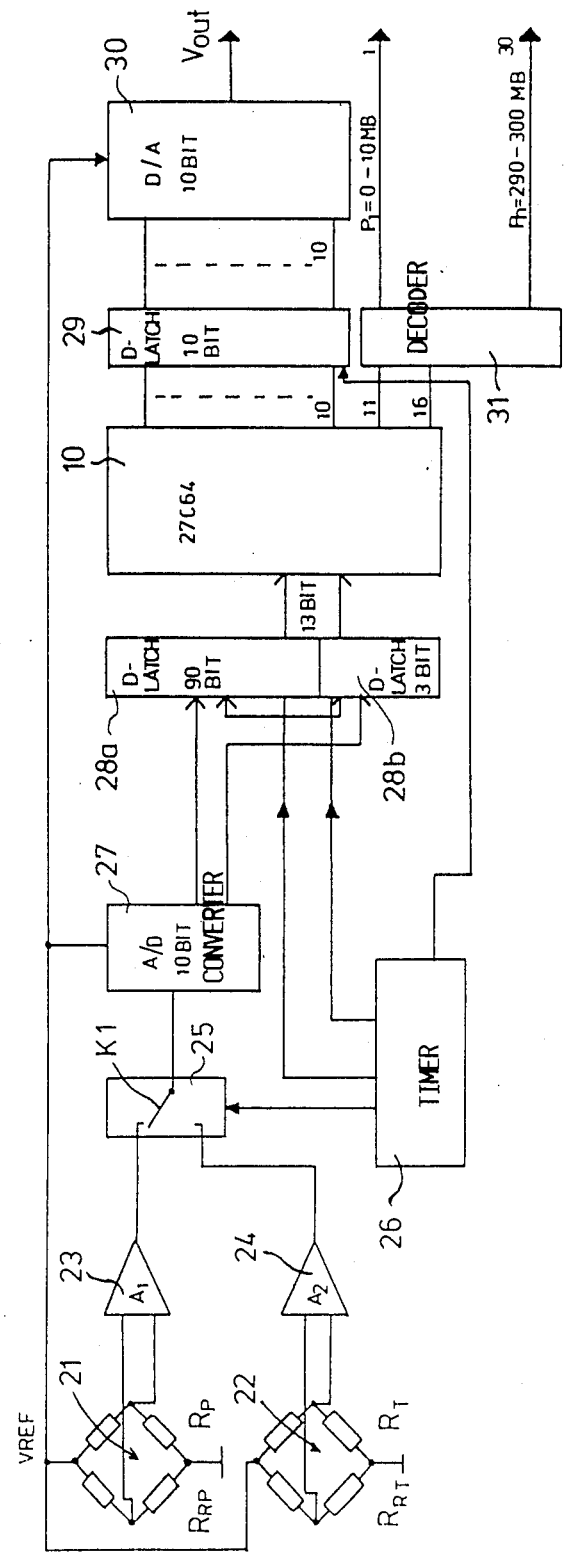
FIG. 6 is a block diagram of a second embodiment of an arrangement in accordance with this invention.

Turning now to FIG. 6, another embodiment of a measuring arrangement comprises a bridge network 21 having a resistor $R_P$ which functions as a pressure measuring impedance sensor, and another bridge network 22 having a resistor $R_T$ which functions as a temperature measuring impedance sensor. Bridge networks 21, 22 respectively have reference resistors $R_{RP}$ and $R_{RT}$.

The balance of each bridge network is sensed by amplifiers 23, 24 having gains $A_1$ and $A_2$, respectively.

A switch $K_1$ in a switching unit 25 is operative to alternately connect an analog-to-digital, 10-bit converter 27 first to the network 21, and then to the network 22. A control/timer unit 26 determines the measuring sequences, and controls the switching unit 25, a 90-bit D-latch 28a, a 3-bit D-latch 28b, and a 10-bit D-latch 29. The binary sensor data or pulses generated in converter 27 are conducted to the latches 28a, 28b which, in turn, conduct the binary sensor data via a 13-bit bus into a memory 10, which is conventionally known as a 27C64 integrated circuit memory chip. The memory 10 is programmed, as previously described, in a calibrating mode.

In the measuring mode, the memory output signal is conducted to the latch 29. Thereafter, a 10-bit, digital-to-analog converter 30 converts the coded output signal to a voltage $V_{out}$, which has been linearized by the memory 10 and which contains the desired information about the pressure and temperature measured by resistors $R_P$ and $R_T$. A decoder 31 generates pulse trains $p_1$ to $p_n$ and is connected to the memory 10.

The resolution of the FIG. 6 arrangement is ten bits. The arrangement is linearized and is temperature-compensated for each sensor by the memory. The measurement speed of the FIG. 6 arrangement can be determined by adding up the various delays caused by the resistor sensors, the conversion time of the converters 27 and 30, and the search time of the memory, among other factors. The data regeneration time is determined by the speeds of the sensors and the overall circuit. The search time of the memory 10 described above in FIG. 6 is about 400 nanoseconds. When using the Multicap measuring circuit 11 of FIG. 5, the data regeneration time is about 200 milliseconds, which is mainly due to the slowness of the measurement of the frequency of the oscillator.

It will be understood that each of the elements described above, or two or more together, also may find a useful application in other types of constructions differing from the types described above.

While the invention has been illustrated and described as embodied in a method of and arrangement for measuring impedance in measuring circuits having programmed memory, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims.

I claim:

1. A method of measuring a physical quantity, such as pressure, temperature or humidity by an impedance sensor having individual characteristic values in said physical quantity under measurement over a range, comprising the steps of:
   (a) successively connecting two stable reference impedances to a measuring circuit;
   (b) alternately connecting the sensor to the measuring circuit;

(c) determining, during a calibrating mode of operation of the measuring circuit, the individual characteristic values in said physical quantity being measured over the range as a function of the two stable reference impedances as successively connected during step (a) and the impedance of the sensor as alternately connected during step (b);

(d) providing a memory having memory addresses and corresponding data storage locations;

(e) storing the individual characteristic values in said physical quantity being measured in step (c) in the data storage locations;

(f) generating, during a measuring mode of operation of the measuring circuit, a memory input addressing signal indicative of a value in said physical quantity being measured; and (g) accessing a memory address with the memory input addressing signal generated in step (f), and obtaining from the data storage location corresponding to said memory address the individual characteristic of said physical value stored therein in step (e).

2. The method as defined in claim 1, wherein each reference impedance is a reference capacitor having a known capacitance value, and wherein the sensor is a capacitive sensor for sensing a variable physical quantity.

3. The method as defined in claim 2, wherein the sensor is used in radiosondes for the telemetrical measurement of atmospheric pressure.

4. The method as defined in claim 2, wherein the sensor is used in radiosondes for the telemetrical measurement of temperature.

5. The method as defined in claim 2, wherein the sensor is used in radiosondes for the telemetrical measurement of humidity.

6. The method as defined in claim 1, wherein the data storage locations are arranged in tables, each table corresponding to a different sensor condition; and wherein the memory addresses include table addresses; and wherein the memory input addressing signal generated in step (f) includes a table signal; and wherein step (g) is performed by accessing a table address with the table signal.

7. The method as defined in claim 1, wherein step (c) is performed by determining a first difference between said physical value of one of the reference impedances and said physical value of the sensor, and by determining a second difference between the physical value of said other reference impedance and the physical value of the sensor, and converting said first and second differences into binary words for storage in the memory.

8. The method as defined in claim 7, wherein the reference impedances are reference capacitors $C_{k1}$ and $C_{k2}$ and the sensor is a capacitor $C_M$ to be measured, and wherein said first difference equals $C_{k2}-C_M$ and said second difference equals $C_{k2}-C_{k1}$.

9. An arrangement for measuring a physical quantity such as pressure, temperature or humidity by an impedance sensor having individual characteristic values in said physical quantity under measurement over a range, comprising:

(a) a measuring circuit;

(b) means for successively connecting two stable reference impedances to the measuring circuit;

(c) means for alternately connecting the sensor to the measuring circuit;

(d) means for determining, during a calibrating mode of operation of the measuring circuit, the individual characteristic values in said physical quantity being measured over a range as a function of the two stable reference impedances during their successive connection and the impedance of the sensor during its alternate connection;

(e) a memory having memory addresses and corresponding data storage locations;

(f) means for storing the individual characteristic values in said physical quantity being measured in the data storage locations;

(g) means for generating, during a messuring mode of operation of the measuring circuit, a memory input addressing signal indicative of a value in said physical quantity being measured; and (h) means for accessing a memory address with the memory input addressing signal, and for obtaining from the data storage location corresponding to said memory address the individual characteristic of said physical value stored therein.

* * * * *